US007081797B1

(12) United States Patent
Bowers

(10) Patent No.: US 7,081,797 B1
(45) Date of Patent: Jul. 25, 2006

(54) MULTIPLYING CURRENT MIRROR WITH BASE CURRENT COMPENSATION

(75) Inventor: Derek F. Bowers, Los Altos Hills, CA (US)

(73) Assignee: Analog Devices, Inc., Norwood, MA (US)

( * ) Notice: Subject to any disclaimer, the term of this patent is extended or adjusted under 35 U.S.C. 154(b) by 82 days.

(21) Appl. No.: 11/021,657

(22) Filed: Dec. 22, 2004

(51) Int. Cl.
*H03F 3/04* (2006.01)

(52) U.S. Cl. ...................................... 330/288; 323/315

(58) Field of Classification Search ................ 330/288; 323/315, 316
See application file for complete search history.

(56) References Cited

U.S. PATENT DOCUMENTS 4,485,351 A * 11/1984 Schemmel et al. ......... 330/288
4,801,892 A * 1/1989 Yamakoshi et al. ......... 330/288
4,879,524 A * 11/1989 Bell ........................... 330/288

* cited by examiner

*Primary Examiner*—Henry Choe
(74) *Attorney, Agent, or Firm*—Kopel, Patrick & Heybl

(57) ABSTRACT

A multiplying current mirror provides at least one base current compensation stage between two other stages that establish a desired gain n. (n−1) compensation stages are provided for n>1, and [(1/n)−1] compensation stages for n<1. The compensation stages can be established as series connected repetitions of a basic cell stage. Each stage after the first includes a diode-connected bipolar transistor, with a low overall transistor count.

39 Claims, 6 Drawing Sheets

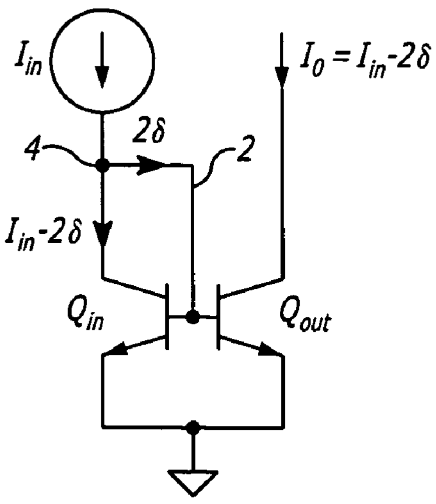
FIG. 1
PRIOR ART
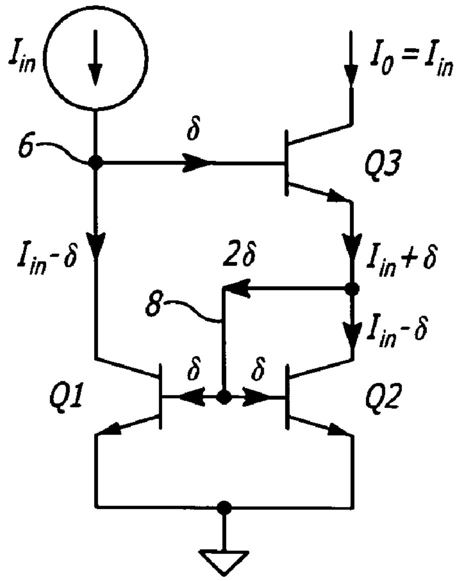
FIG. 2
PRIOR ART
FIG. 3
PRIOR ART
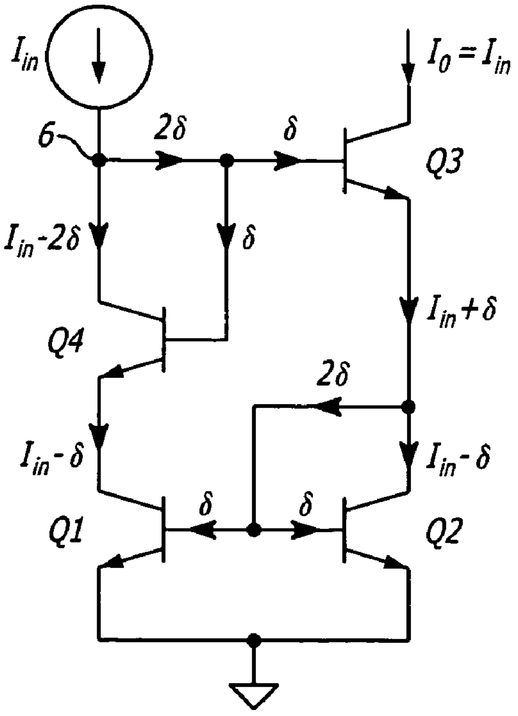

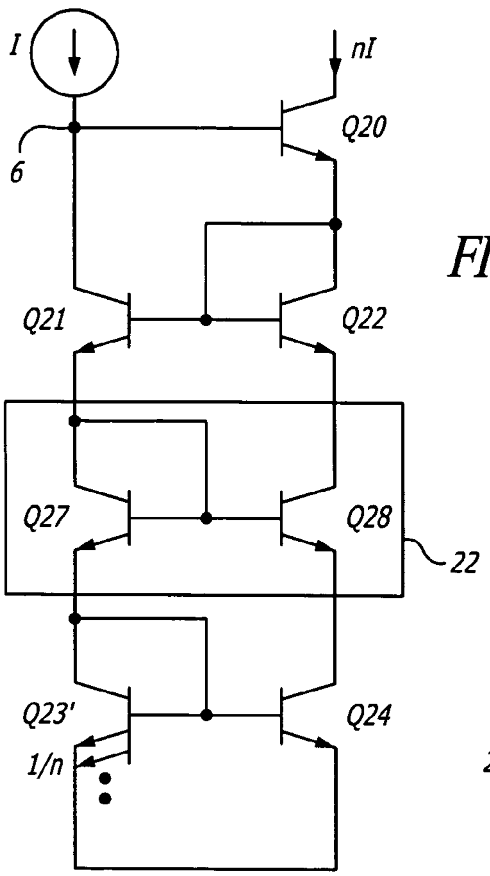
FIG. 13
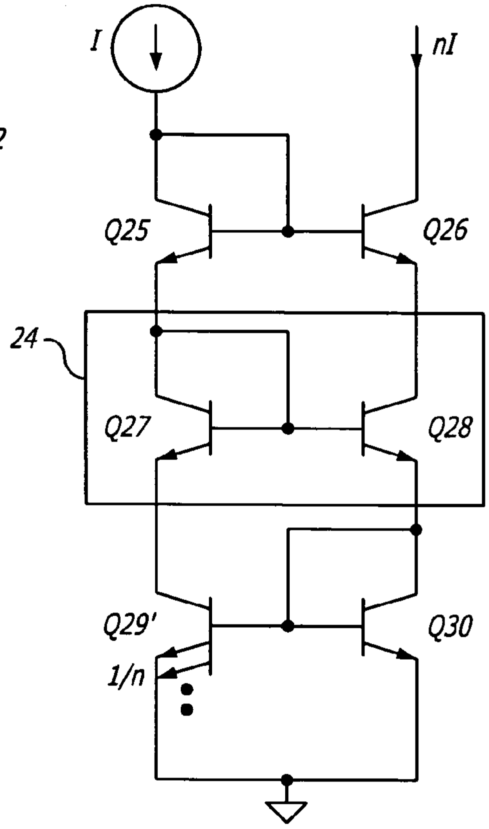
FIG. 14
FIG. 15
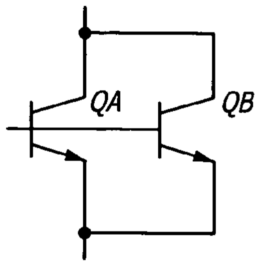

MULTIPLYING CURRENT MIRROR WITH BASE CURRENT COMPENSATION

BACKGROUND OF THE INVENTION

1. Field of the Invention

This invention relates to multiplying current mirrors, and more particularly to multiplying current mirrors with base current compensation.

2. Description of the Related Art

A multiplying current mirror produces an output current that is a multiple of an input reference current. The base currents required by transistors in the mirror circuit introduce an error, and to date a multiplying current mirror with full base current compensation has not been available.

A simple current mirror is illustrated in FIG. 1. An input reference current Iin flows in an input branch which includes a diode-connected bipolar transistor Qin, with its collector connected to its emitter by a diode connector line 2. Although npn transistors are illustrated, pnp transistors could also be used, with an appropriate adjustment of circuit connections. Another bipolar transistor Qout constitutes an output branch, with its base connected in common with the base of Qin. The mirror produces an output current Io into the collector of Qout which is equal in magnitude to Iin, but with an error of 2δ, where δ is the transistor base current equal to the collector current divided by the transistor current gain β. The emitters of the two transistors are connected in common to a voltage reference, typically ground.

The reason for the 2δ error in Io is illustrated in the figure. Iin flows into an input node 4 in the input branch, with a current of 2δ diverted to diode connector line 2 to supply the base currents of Qin and Qout. The result is a current of I−2δ which flows into the collector of Qin, and it is this current that is mirrored into the collector of Qout.

A mirror circuit which compensates for the 2δ error, commonly called a Wilson current mirror, is illustrated in FIG. 2. In this circuit, the input branch consists of a bipolar transistor Q1, while the output branch consists of a diode-connected transistor Q2 whose base is connected in common with the base of Q1, and another bipolar transistor Q3 that receives Io at its collector, has its emitter connected in series with the collector of Q2, and its base connected to an input node 6 in the input branch which receives Iin and is also connected to the collector of Q1.

Q3 diverts a base current δ away from Iin, leaving a current equal to Iin-δ for the collector of Q1. This current is mirrored via the common base connection of Q1 and Q2 to the collector of Q2, with the Q2 diode connector line 8 carrying a current of 2δ to supply the base currents for Q1 and Q2. Since the emitter current of Q3 is divided between the. Iin−δ collector current of Q2 and the 2δ current in diode connector line 8, the Q3 emitter current sums to Iin+δ. Subtracting out the δ base current component of the Q3 emitter current leaves an output current Io in the collector of Q3 equal to Iin, thus removing the base current error.

The collector voltage of Q1 is one base-emitter voltage drop (typically about 0.6 volts) higher than the collector voltage of Q2, due to the base-emitter junction of Q3 which separates these two points. This is a minor source of error. To compensate for it, a diode-connected bipolar transistor Q4, shown in FIG. 3, has been inserted in the collector line to Q1, with the base and collector of Q4 connected to input node 6, and the emitter of Q4 connected to the collector of Q1. With this circuit, the collectors of Q1 and Q2 are both one base-emitter voltage drop level below the voltage at input node 6, and are therefore equal to each other. The modified Wilson current mirror of FIG. 3 is accordingly more accurate than the simple Wilson current mirror of FIG. 2. However, it is limited to an output current equal in magnitude to the input current, and thus does not provide for the many situations in which a multiple of the input current is desired at the output.

FIG. 4 illustrates a modification of the FIG. 2 circuit to provide an output current equal to twice the input current. It has the same configuration as FIG. 2, except the single-emitter diode-connected transistor Q2 in FIG. 2 is replaced with a double-emitter transistor Q2'. This causes the current flowing into the collector of Q2' to be twice the collector current of Q1. However, because double-emitter device Q2' draws a base current of 2δ, a base current error equal to −2δ is reintroduced into the output current Io. The various current flows from which this error is derived are illustrated in FIG. 4.

A similar situation results when the Wilson current mirror of FIG. 2 is modified to produce an output mirrored current less than the input reference current, or in other words to provide a current mirror gain of less than unity. This is illustrated in FIG. 5, which has the same configuration as FIG. 2 except single-emitter transistor Q1 in the input branch of FIG. 2 is replaced by a double-emitter transistor Q1' to achieve an output current equal to half the input current. Again, this results in a base current error at the output. The error is 3δ/2, the derivation of which can be obtained from the various current flows illustrated in the figure.

Another current mirror with base current compensation, illustrated in FIG. 6, was mentioned by A. S. Sedra at the Special Session on Current Mode Analog I. C. Design, IEEE Symposium on Circuits and Systems, Portland, Oreg., June 1989. This circuit has a single input reference current Iin, and two output branches producing respective output currents Io1 and Io2, both approximately equal to Iin. The input branch consists of three transistors Q5, Q6 and Q7 connected in series, with Q5 diode-connected and receiving the input current, and Q7 having its emitter connected to the voltage reference.

The first output branch consists of transistors Q8, Q9 and Q10 connected in series between Io1 and the voltage reference, while the second output branch consists of transistors Q11, Q12 and Q13 connected in series between Io2 and the voltage reference. The first transistors in each branch Q5, Q8 and Q11 have their bases connected in common, as do the second transistors Q6, Q9, and Q12 and the third transistors Q7, Q10 and Q13. Q5, Q9 and Q13 are diode-connected, while the other transistors are not.

The current flows established at various locations in the circuit are illustrated in the figure, resulting in output currents from each output branch equal approximately to Iin. However, the circuit is fairly device intensive, requiring a minimum of nine transistors.

SUMMARY OF THE INVENTION

The present invention provides a multiplying current mirror with base current compensation and a gain of n, where n can be either a whole number greater than 1, or the inversion of a whole number greater than 1. In one embodiment, an internal current mirror has a first stage which receives the mirror input and output currents, and an additional stage connected in series with the first stage and including a multiplier transistor circuit which establishes the gain. (n−1) base current compensation stages are also provided when n>1, and [(1/n)−1] base current compensation stages when n<1, with the compensation stages connected in series with each other and with the first two stages to compensate for base current errors associated with the internal current mirror. Each of the compensation stages preferably includes a non-diode connected bipolar transistor in one of the input and output branches, and a diode-connected transistor in the other branch, with a common base connection between the two. The compensation stages are preferably connected in series between the first and additional stages. The multiplying transistor circuit can be implemented with a multiple-emitter transistor circuit, which can be either a multiple-emitter transistor or multiple single-emitter transistors connected in parallel, and is located in the output branch for gains greater than 1, and in the input branch for fractional gains.

The base current compensation stages can be generalized to a cell stage having respective bipolar transistors in the input and output branches, with their bases connected together and only one being diode-connected, (n−2) repetitions of the cell stage connected in series therewith for n>2, and [(1/n)−2] repetitions of the cell stage for (n<½).

In another aspect of the invention, a plurality of stages are connected in series and equal in number to (n+1) for n>1 and to [(1/n)+1] for n<1, with each stage including respective portions of the current mirror input and output branches, and the first stage receiving the input and output currents. Each stage after the first includes a diode-connected bipolar transistor, with intrastage and interstage connections that establish currents in each of the diode connections of (n+1)δ for n>1 and [(1/n)+1]δ for n<1, where δ is the base current required for a single-emitter transistor. The diode connection currents compensate the output current for the mirror's transistor base currents.

These and other features and advantages of the invention will be apparent to those skilled in the art from the following detailed description, taken together with the accompanying drawings, in which:

BRIEF DESCRIPTION OF THE DRAWINGS

FIGS. 1–6 are schematic diagrams illustrating prior art circuits, described above;

FIG. 11 is a schematic diagram of a current mirror similar to FIG. 7, but generalized to account for current gains greater than two, while

FIGS. 13 and 14 are schematic diagrams of circuits corresponding to the circuits of FIGS. 9 and 10, respectively, generalized to account for current gains less than one-half; and FIG. 15 is a schematic diagram of two single-emitter transistors connected in parallel.

DETAILED DESCRIPTION OF THE INVENTION

The invention provides an approach to current mirrors that allows for output current gains of n relative to the input current, where n can range from a whole number greater than one (e.g. 2, 3, 4, . . . ) to the inversion of a whole number greater than one (e.g. ½, ⅓, ¼, . . . ). At the same time, the mirror provides a base current compensation that results in an output current closely mirroring the input current, subject to the desired current gains.

Figure 7:
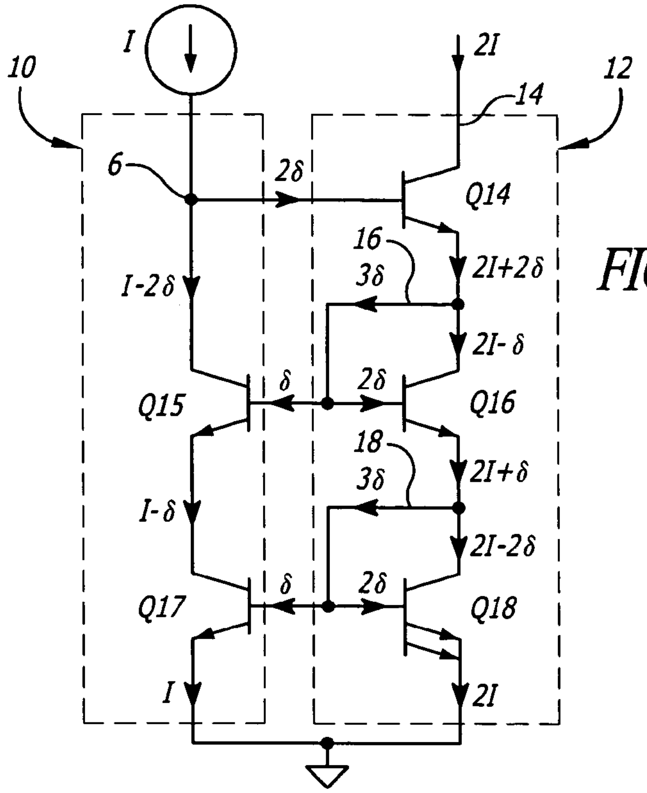
FIG. 7 is a schematic diagram of a multiplying current mirror in accordance with the invention, with a gain greater than 1.

An application of the invention to a current mirror with a gain of 2 is illustrated in FIG. 7. The circuit may be conceptualized as being divided into an input branch 10, with a reference or input current I flowing into the input node 6, and an output branch 12 into which an output mirrored current flows on output line 14. As illustrated, the mirror has an output current equal to 2I.

A first stage of the mirror circuits consists of input node 6 in the input branch, connected to the base of an npn bipolar transistor Q14 in the output branch, with the collector of Q14 connected to output line 14. Connected in series with the first stage is a second stage consisting of transistor Q15 in the input branch, having its base connected in common with the base of another bipolar transistor Q16 in the output branch. The collector and base of Q16 are tied together in a diode connection.

An additional or third stage, connected in series with the first and second stages, comprises another bipolar transistor Q17 which has its base connected in common with the base of a multiple-emitter, diode-connected transistor circuit Q18. Q18 is illustrated as a double-emitter transistor, but it could also be implemented with a pair of single-emitter transistors connected in parallel, or a single transistor whose emitter is scaled to a double area; the various implementations are equivalent for purposes of the invention.

Figure 4:
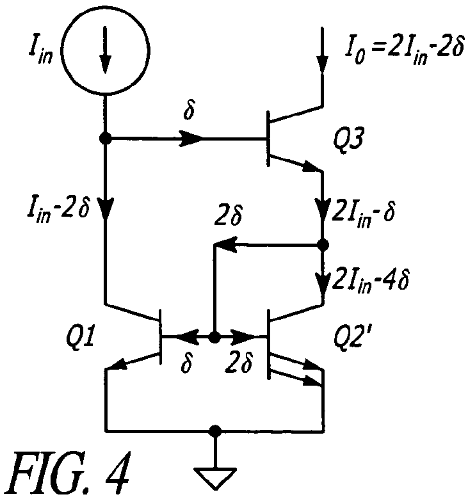
FIG. 4 PRIOR ART
Figure 5:
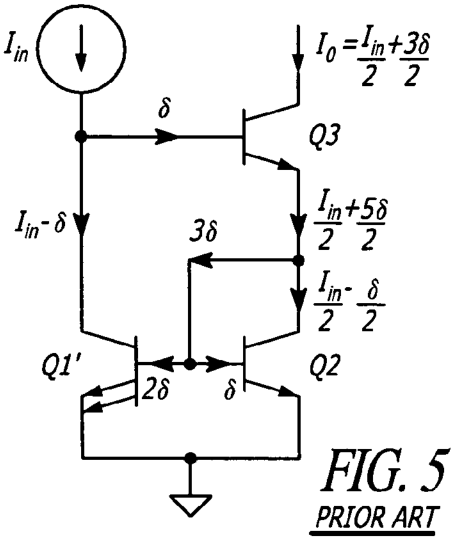
FIG. 5 PRIOR ART
Figure 6:
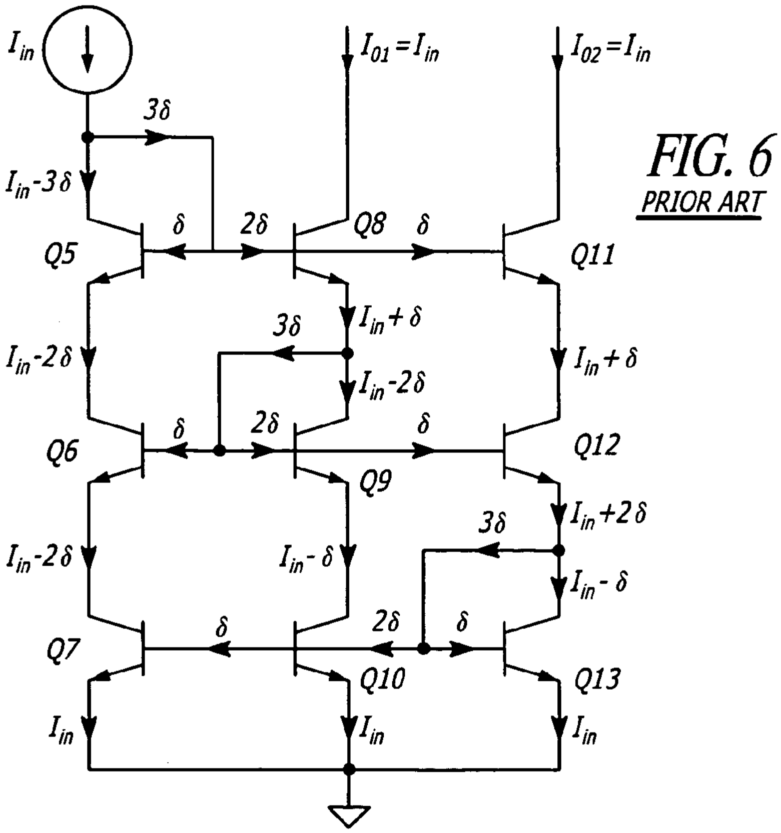
FIG. 6 PRIOR ART

Without the middle Q15/Q16 stage, the FIG. 7 current mirror reduces to the uncompensated prior multiplying current mirror of FIG. 4. The first and third stages function is an internal current mirror, while the middle stage acts as a base current compensation stage, resulting in an output current of 2I, without the 2δ output error factor of the FIG. 4 circuit. The magnitude of current flows throughout the circuit which results in this compensation are illustrated in the figure. The input current I divides at input node 6, with 2δ going to the base of Q14, and I−2δ to the collector of Q15. Assuming an output current from the collector of Q14 equal to 2I, the emitter current of Q14 is 2I+2δ. This current divides into 3δ flowing into the diode connector 16 for Q16, and 2I−δ into the collector of Q16. The current in diode connector line 16 divides into a 6 base current for Q15, and a 2δ base current for Q16.

Summing their respective collector and base currents, the emitter current of Q15 is I−δ, while the emitter current of Q16 is 2I+6. The latter current divides into a 3δ current in the Q18 diode connector line 18, and a 2I−2δ collector current for Q18. The current on line 18 divides into a δ base drive for Q17, and a 2δ base drive for Q18. The result is currents of I and 2I through the emitters of Q17 and Q18, respectively.

In achieving the desired base current compensation, currents of 3δ flow in each of the diode connector lines 16 and 18. For preferred embodiments of the invention with mirrored current gains of n, where n is a whole number greater than 1 or the inversion of a whole number greater than 1, this can be generalized to diode connection currents of (n+1)δ for n>1 and [(1/n)+1]δ for n<1.

Figure 8:
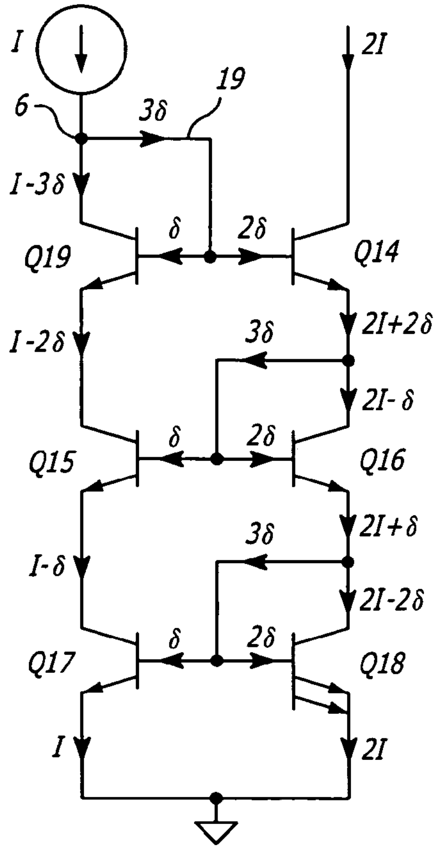
FIG. 8 is a schematic diagram of a modification of the FIG. 7 circuit.

A modification of the FIG. 7 circuit which eliminates the voltage differential between the collectors of Q17 and Q18, in a manner similar to the modification of FIG. 2 shown in FIG. 3, is presented in FIG. 8. A diode-connected bipolar transistor Q19 is added to the input branch of the first stage, with its collector connected to input node 6, its base connected to the base of Q14, and its emitter connected to the collector of Q15. The diode connector line 19 for Q19 draws a current of 3δ from the input current, with 2δ going to the base of Q14 and δ to the base of Q19, leaving a Q19 collector current of I−3δ. The current flows in the rest of the circuit remain the same as in FIG. 7, with the current in each of the diode connecter lines still equal to (n+1)δ, or 3δ for the multiply-by-two mirror illustrated.

Figure 9:
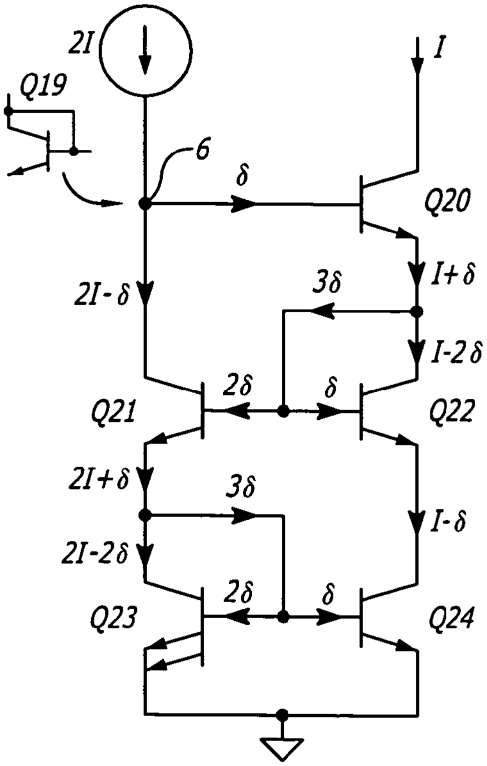
FIGS. 9 and 10 are schematic diagrams of two different mirrors in accordance with the invention, each with a current gain less than one.

FIG. 9 illustrates a current mirror in accordance with the invention with a gain of ½. It has a configuration somewhat similar to FIG. 7, with input and output branches divided between three stages, but the transistor connections and locations are somewhat changed. However, a common feature of both circuits, as well as the other circuits illustrative of the invention described herein, is that each stage includes one transistor device that is diode-connected, and one that is not.

In this case the input current is 2I and the output current is I, to provide the desired gain of ½. In the first stage, the input node 6 in the input branch is connected to the base of a bipolar transistor Q20 in the output branch of that stage. The second (base current compensation) stage consists of a bipolar transistor Q21 in the input branch, with its base connected to a diode-connected bipolar transistor Q22 in the output branch. The third stage comprises a diode-connected double emitter transistor circuit Q23 in the input branch, with its base connected to the base of a bipolar transistor Q24 in the output branch. All three branches are connected in series.

The current flows through the circuit are indicated in the figure. The result is an output mirror current half that of the input current, without a base current error. Optional transistor Q19, corresponding to the same element in FIG. 8, is illustrated next to input node 6 to indicate that it could be added to the circuit in a manner similar to FIG. 8.

Figure 10:
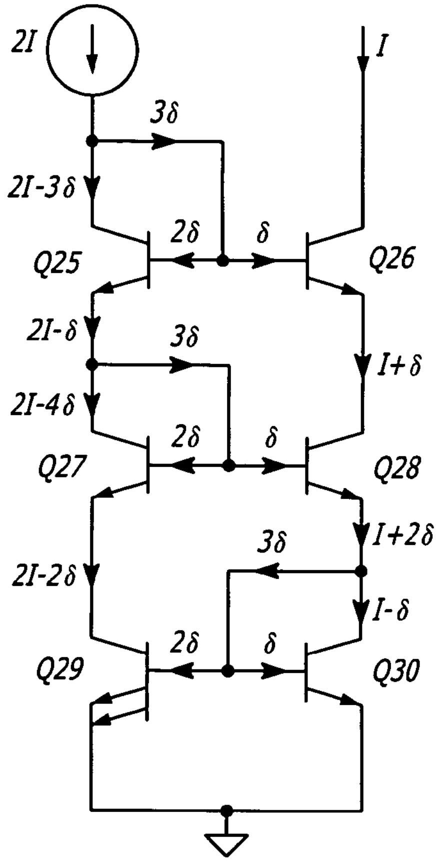

An alternate circuit within the scope of the invention for achieving a current gain of ½ is illustrated in FIG. 10. Three stages are again divided into input and output branches, with an input current 2I directed into the input branch to produce an output current I from the output branch. The first stage consists of a diode-connected bipolar transistor Q25 in the input stage, with its base connected in common with the base of a bipolar transistor 26 in the output branch. In the second stage, another diode-connected transistor Q27 is provided in the input branch, with its base connected in common with the base of a transistor Q28 in the output branch. The third or highest order stage has a double-emitter transistor circuit Q29 in the input branch, with its base connected in common with the base of diode-connected transistor Q30 in the output branch. Again, all three circuits are connected in series. From the current flows indicated in the figure, it can be seen that a current gain of ½ is achieved, while substantially eliminating base current error in the output current.

Figure 11:
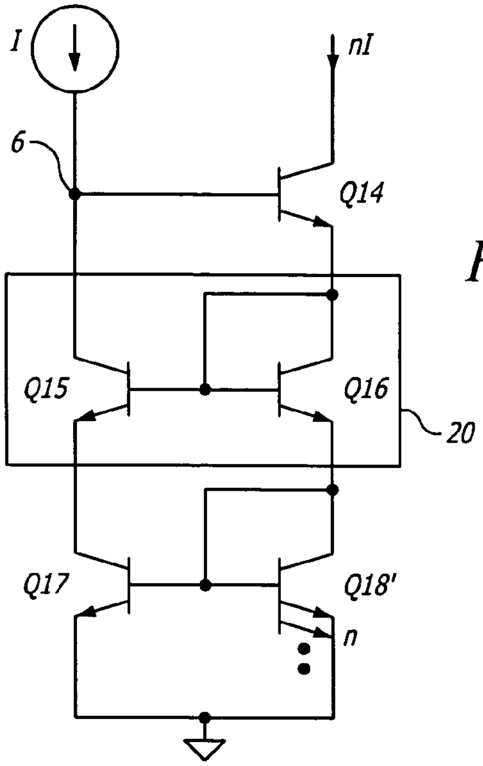

An extrapolation of the FIG. 7 circuit, from which current gains greater than two can be obtained, is illustrated in FIG. 11. The second or base current compensating stage is indicated as a cell stage 20. To achieve current gains greater than two, (n−2) repetitions of the cell stage are connected in series with the first cell stage, and the number of emitters in multiple-emitter transistor circuit Q18' is increased to n. The result is an output mirrored current equal to nI, again without substantial base current error.

Figure 12:
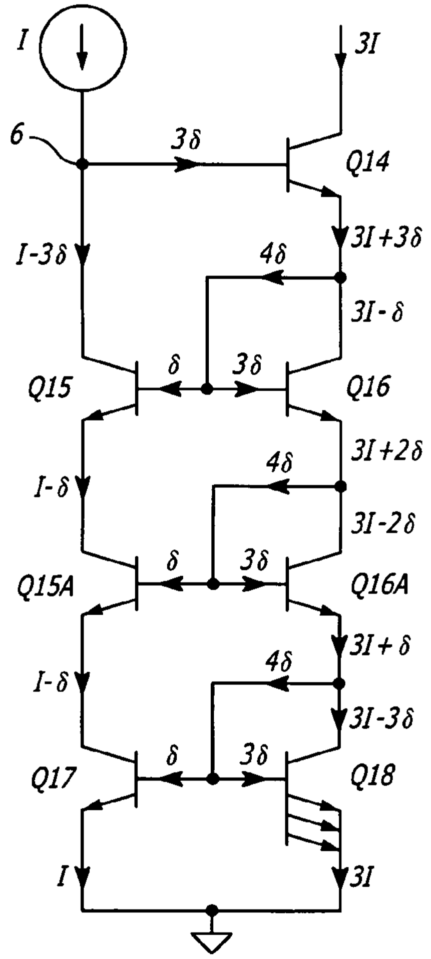
FIG. 12 is a schematic diagram of the FIG. 11 circuit, expanded to provide a current gain of three.

The application of this concept to a multiplying current mirror with a gain of three is illustrated in FIG. 12. The base cell circuit, consisting of transistors Q15 and Q16 as in FIG. 11, is connected in series with a repetition of the cell circuit consisting of bipolar transistor Q15A in the input branch and diode-connected bipolar transistor Q16A in the output branch. The current flows which result in an output current of 3I for an input current of I, without substantial base current error, are indicated in the figure. The multiple-emitter transistor circuit Q18' has three emitters.

A similar extrapolation of the FIG. 9 divide-by-two circuit is illustrated in FIG. 13, with common elements indicated by the same reference numbers. In this case, which is applicable to n<½, the second stage is supplemented with a cell circuit 22, comprising a diode-connected bipolar transistor Q27 in the input branch having a common base connection with a bipolar transistor Q28 in the output branch. The transistors Q21 and Q22 are connected in series between the first and cell stages. The number of emitters in multiple emitter transistor circuit Q23' in the input branch is equal to 1/n (recalling that n is less than one for this circuit), resulting in an output current of nI for an input current of I. One cell stage 22 would be provided for n=⅓, two cell stages for n=¼, three cell stages for n=⅕, etc.

FIG. 14 illustrates a similar extrapolation of the gain=½ current mirror of FIG. 10. In this case, the cell stage 24 comprises transistors Q27 and Q28. A single cell circuit is provided for n=½, two cell circuits in series for n=⅓, etc. The number of emitters in multiple emitter-transistor circuit Q29' is set at 1/n (with n<1), resulting in an output mirrored current of nI for an input current of I. Again, the cell circuits provide the desired base current compensation.

As mentioned previously, one way to implement the multiple-emitter transistor circuit which establishes the basic mirror gain is with multiple single-emitter transistors connected in parallel. Such a circuit is illustrated in FIG. 15, consisting of transistors QA and QB, with their respective collectors, bases and emitters connected together. Placed in the output branch, this circuit would produce a gain of 2, while in the input branch it would produce a gain of ½.

While several different embodiments of the invention have been shown and described, numerous variations and additional embodiments can be envisioned. For example, while npn transistors are illustrated in the embodiments described above, the invention could also be implemented with pnp transistor circuitry. Accordingly, it is intended that the invention be limited only in terms of the appended claims.

I claim:

1. A multiplying current mirror for mirroring an input current in an input branch with an output current in an output branch, said output current having a gain of n relative to the input current, where n is a whole number greater than one or the inversion of a whole number greater than one, comprising:

a two-stage internal current mirror comprising a first stage connected to receive said input and output currents, and an additional stage connected in series with said first stage and including a multiplying transistor circuit which establishes said gain, and (n−1) base current compensation stages for n>1, and [(1/n)−1] base current compensation stages for n<1, said compensation stages connected in series with each other and with said first and additional stages, and compensating for base current errors associated with said internal current mirror.

2. The current mirror of claim 1, each of said compensation stages comprising a non-diode connected bipolar transistor in one of said input and output branches, and a diode-connected transistor in the other of said branches having a common base connection with said non-diode connected bipolar transistor.

3. The current mirror of claim 1, said multiplying transistor circuit comprising a multiple-emitter transistor circuit.

4. The current mirror of claim 3, said multiple emitter transistor circuit comprising a multiple-emitter bipolar transistor.

5. The current mirror of claim 3, said multiple-emitter transistor circuit comprising a plurality of single-emitter bipolar transistors connected in parallel.

6. The current mirror of claim 1, wherein said base current compensation stages are connected in series between said first and additional stages.

7. A multiplying current mirror for mirroring an input current in an input branch with an output current in an output branch, said output current having a gain of n relative to the input current, where n is a whole number greater than one or the inversion of a whole number greater than one, comprising:

a first stage comprising a bipolar transistor in said output branch having its base connected to said input branch at a node which receives said input current, and its collector-emitter circuit receiving said output current, a second stage connected in circuit with said first stage and comprising a cell stage which comprises respective bipolar transistors in said input and output branches, only one of said cell stage transistors being diode-connected, the bases of said cell stage transistors connected together, $(n-2)$ repetitions of said cell stage connected in series therewith for $n>2$, and $[(1/n)-2]$ repetitions of said cell stage connected in series therewith for $(n<½)$, and a third stage connected in series with said second stage and comprising a multiple-emitter bipolar transistor circuit in one of said branches, and a bipolar transistor in the other of said branches whose base is connected to a base of said multiple-emitter transistor circuit, said multiple-emitter transistor circuit being in said output branch for $n>1$ and in said input branch for $n<1$, only one of said multiple-emitter transistor circuit and said third stage bipolar transistor being diode-connected.

8. The current mirror of claim 7, wherein $n>1$, said multiple-emitter transistor circuit is in said output branch, and both said multiple-emitter transistor circuit and the second stage transistors in said output branch are diode-connected.

9. The current mirror of claim 7, wherein $n<1$, said multiple-emitter transistor circuit is in said input branch, and the input branch first and second stage transistors as well as said output branch third stage transistor are diode-connected.

10. The current mirror of claim 7, wherein $n<½$, said second stage further comprising a bipolar transistor in said input branch and a diode-connected bipolar transistor in said output branch having a common base connection and connected in series between said first and cell stages.

11. The current mirror of claim 10, wherein said multiple-emitter transistor circuit is in said input branch, and said output branch second stage transistor along with said multiple-emitter transistor circuit are diode-connected.

12. The current mirror of claim 7, said first stage further comprising a diode-connected transistor in said input branch having its base connected to the base of the transistor in said first stage output branch.

13. The current mirror of claim 7, said multiple-emitter transistor circuit comprising a multiple-emitter bipolar transistor.

14. The current mirror of claim 7, said multiple-emitter transistor circuit comprising a plurality of single-emitter bipolar transistors connected in parallel.

15. The current mirror of claim 7, said first and cell stages each having not more than two respective transistors, and said third stage having not more than one multiple-emitter bipolar transistor circuit in one of said branches and not more than one bipolar transistor in the other of said branches.

16. A multiplying current mirror for mirroring an input current in an input branch with an output current in an output branch, said output current having a gain of n relative to the input current, where n is a whole number greater than one or the inversion of a whole number greater than one, comprising:

a plurality of stages connected in series and equal in number to $(n+1)$ for $n>1$ and to $[(1/n)+1]$ for $n<1$, with each of said stages including respective portions of said input and output branches, and the first stage receiving said input and output currents, each of said stages after the first stage including a diode-connected bipolar transistor, with intrastage and interstage connections that establish currents in each of said diode connections of $(n+1)\delta$ for $n>1$ and $[(1/n)+1]\delta$ for $n<1$, where $\delta$ is the base current for a single-emitter transistor, said diode connection currents compensating said output current for the transistor base currents of said current mirror.

17. The current mirror of claim 16, wherein said first stage includes a bipolar transistor in said output branch, and the highest order stage includes a multiple-emitter transistor circuit.

18. The current mirror of claim 17, wherein $n>1$, and said multiple-emitter transistor circuit and diode-connected transistors are in said output branch, said multiple-emitter transistor circuit comprising at least one of said diode-connected transistors.

19. The current mirror of claim 17, wherein $n<1$, said multiple-emitter transistor circuit is in said input branch, said diode-connected transistor in said highest order stage is in said output branch, and said diode-connected transistor in each of said stages after the first stage but before the highest order stage is in said input branch, further comprising a diode-connected transistor in said first stage within said input branch.

20. The current mirror of claim 17, wherein $n<½$, said multiple-emitter transistor circuit is in said input branch, the second stage comprises a bipolar transistor in said input branch and a diode-connected bipolar transistor in said output branch, and the remaining stages between said second stage and said highest order stage include respective ones of said diode-connected bipolar transistors in said input branch.

21. The current mirror of claim 16, said first stage comprising a bipolar transistor in said output branch connected to receive said output current, and a base connection for said bipolar transistor in said input branch.

22. The current mirror of claim 21, said first stage further comprising a diode-connected bipolar transistor in said input branch, with said base connector comprising a connection between the base and collector of said first stage diode-connected transistor and the base of said first stage output branch transistor.

23. The current mirror of claim 16, the highest order of said stages comprising a bipolar transistor and a multiple-emitter bipolar transistor circuit having a common base connection with said bipolar transistor, one of said highest order stage bipolar transistor and multiple-emitter bipolar transistor circuit being diode-connected.

24. The current mirror of claim 16, the highest order stage having only one multiple-emitter bipolar transistor circuit in one of said branches and only one bipolar transistor in the other of said branches, and the remaining stages each having not more than two respective transistors.

25. A gain-of-two current mirror for mirroring an input current in an input branch with an output current in an output branch, said output current having a gain of two with respect to said input current, comprising:

first, second and third stages connected in series, said first stage having an input current terminal in said input branch and a bipolar transistor in said output branch, with the base of said transistor connected to said input current terminal, said second stage comprising a bipolar transistor in said input branch, and a diode-connected bipolar transistor in said output branch having a common base connection with said second stage bipolar transistor, said third stage comprising a bipolar transistor in said input branch, and a diode-connected double-emitter bipolar transistor circuit in said output branch having a common base connection with said third stage bipolar transistor.

26. The current mirror of claim 25, said first stage further comprising a diode-connected transistor in said input branch having its base connected to the base of the transistor in said first stage output branch.

27. The current mirror of claim 25, said double-emitter transistor circuit comprising a double-emitter bipolar transistor.

28. The current mirror of claim 25, said double-emitter transistor circuit comprising a plurality of single-emitter bipolar transistors connected in parallel.

29. The current mirror of claim 25, said first and second stages each having not more than one transistor in each of said branches, and said third stage having not more than one transistor in said input branch and not more than one double-emitter transistor circuit in said output branch.

30. A divide-by-two current mirror for mirroring an input current in an input branch with an output current in an output branch, said output current having a gain of one-half with respect to said input current, comprising:

a first stage comprising a bipolar transistor in said output branch having its base connected to said input branch at a node which receives said input current, and its collector-emitter circuit receiving said output current, a second stage in series with said first stage and comprising a bipolar transistor in said input branch, and a diode-connected bipolar transistor in said output branch, said second stage transistors having their bases connected in common, and a third stage in series with said second stage and comprising a double-emitter bipolar transistor circuit in said input branch and a bipolar transistor in said output branch, said third stage bipolar transistor and double-emitter bipolar transistor circuit having their bases connected in common.

31. The current mirror of claim 30, the input branch in said first stage comprising a short circuit between said input terminal and the input branch in said second stage.

32. The current mirror of claim 30, said first stage further comprising a diode-connected transistor in said input branch having its base connected to the base of the transistor in said first stage output branch.

33. The current mirror of claim 30, said double-emitter transistor circuit comprising a double-emitter bipolar transistor.

34. The current mirror of claim 30, said double-emitter transistor circuit comprising a plurality of single-emitter bipolar transistors connected in parallel.

35. The current mirror of claim 30, said first and second stages each having not more than one transistor per branch, and said third stage having not more than one double-emitter bipolar transistor circuit in said input branch and not more than one transistor in said output branch.

36. A divide-by-two current mirror for mirroring an input current in an input branch with an output current in an output branch, said output current having a gain of one-half with respect to said input current, comprising:

a first stage comprising a bipolar transistor in said output branch and a diode-connected bipolar transistor in said input branch, with the bases of said transistors connected in common, a second stage in series with said first stage and comprising a bipolar transistor in said output branch and a diode-connected bipolar transistor in said input branch, with the bases of said second stage transistors connected together, and a third stage in series with said second stage and comprising a double-emitter bipolar transistor circuit in said input branch and a diode-connected bipolar transistor in said output branch, said third stage diode-connected bipolar transistor and said double emitter bipolar transistor circuit having their bases connected in common.

37. The current mirror of claim 36, said double-emitter transistor circuit comprising a double-emitter bipolar transistor.

38. The current mirror of claim 36, said double-emitter bipolar transistor circuit comprising a plurality of single emitter bipolar transistors connected in parallel.

39. The current mirror of claim 36, said first and second stages each having not more than one transistor per branch, and said third stage having not more than one double emitter bipolar transistor circuit in said input branch and not more than one transistor in said output branch.

* * * * *